United States Patent
Ilatikhameneh et al.

(10) Patent No.: US 10,141,436 B2
(45) Date of Patent: Nov. 27, 2018

(54) TUNNEL FIELD EFFECT TRANSISTOR HAVING ANISOTROPIC EFFECTIVE MASS CHANNEL

(71) Applicant: Purdue Research Foundation, West Lafayette, IN (US)

(72) Inventors: Hesameddin Ilatikhameneh, Waukegan, IL (US); Tarek Ameen Beshari, West Lafayette, IN (US); Bozidar Novakovic, West Lafayette, IN (US); Gerhard Klimeck, West Lafayette, IN (US); Rajib Rahman, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 93 days.

(21) Appl. No.: 15/479,247

(22) Filed: Apr. 4, 2017

(65) Prior Publication Data
US 2018/0254335 A1    Sep. 6, 2018

Related U.S. Application Data

(60) Provisional application No. 62/317,835, filed on Apr. 4, 2016.

(51) Int. Cl.
 *H01L 29/768*    (2006.01)
 *H01L 29/739*    (2006.01)
 (Continued)

(52) U.S. Cl.
 CPC ...... *H01L 29/7391* (2013.01); *H01L 29/0847* (2013.01); *H01L 29/1033* (2013.01); *H01L 29/267* (2013.01)

(58) Field of Classification Search
 None
 See application file for complete search history.

(56) References Cited

U.S. PATENT DOCUMENTS

| 7,833,892 B2 | 11/2010 | Parekh et al. |
| 2017/0213854 A1* | 7/2017 | Wang ............... H01L 27/1225 |
| 2018/0012962 A1* | 1/2018 | Yeh ................. H01L 27/0886 |

FOREIGN PATENT DOCUMENTS

| KR | 2002-0089943 | * 11/2002 | ............ G02F 1/136 |
| KR | 10-2007-0047400 | * 5/2007 | ............ H01L 2/786 |
| TW | 201440219 | * 10/2014 | ............ H01L 29/78 |

OTHER PUBLICATIONS

Machine translation, Morita, Taiwanese Pat. Pub. No. TW 201440219, translation date: Jul. 20, 2018, Espacenet, all pages.*

(Continued)

*Primary Examiner* — Victoria K Hall
(74) *Attorney, Agent, or Firm* — Piroozi-IP, LLC

(57) ABSTRACT

A tunnel field effect transistor (TFET) includes a substrate, heavily doped source and drain regions disposed at opposite ends of a channel region forming a PiN or NiP structure, the channel region including a first substantially parallelogram portion having a first length defined along a longitudinal axis extending from the source region to the drain region and a second substantially parallelogram portion having a second length defined along the longitudinal axis larger than the first length, the TFET device having an effective channel length that is an average of the first and second lengths. The channel region includes a channel material with a first effective mass along a longitudinal axis extending from the source region to the drain region and a second effective mass along a lateral axis perpendicular to the longitudinal axis, the first effective mass being greater than the second effective mass.

10 Claims, 14 Drawing Sheets

(51) Int. Cl.
H01L 29/267 (2006.01)
H01L 29/08 (2006.01)
H01L 29/10 (2006.01)

(56) References Cited

OTHER PUBLICATIONS

S. Agarwal & E. Yablonovitch, Why Tunneling FETs Don't Work, and How to Fix It, 2013 Third Berkeley Symposium on Energy Efficient Electronic Systems (E3S), Oct. 28-29, 2013, all pages.*
Y. Lu et al., Geometry dependent Tunnel FET performance—Dilemma of electrostatics vs. quantum confinement, 68th Device Research Conference, Jun. 21-23, 2010, pp. 17-18.*
W. Cao et al., 2D/3D Tunnel-FET: Toward Green Transistors and Sensors, ECS Transactions, vol. 77, Issue 5, May 28, 2017-Jun. 1, 2017, pp. 185-189.*
D. Yin et al., Scaling Limit of Bilayer Phosphorene FETs, Sep. 2015, IEEE Electron Device Letters, vol. 36, No. 9, pp. 978-980.*
D. Yin & Y. Yoon, Design strategy of two-dimensional material field-effect transistors: Engineering the number of layers in phosphorene FETs, Jun. 7, 2016, J. Applied Physics, vol. 119, No. 21, pp. 214312-1 to 214312-8.*
M. Salmani-Jelodar et al., Design Guidelines for Sub-12 nm Nanowire MOSFETs, Mar. 2015, IEEE Transactions on Nanotechnology, vol. 14, No. 2, pp. 210-213.*
H. Ilatikhameneh et al., Tunnel Field-Effect Transistors in 2-D Transition Metal Dichalcogenide Materials, Apr. 14, 2015, IEEE Journal on Exploratory Solid-State Computational Devices and Circuits, vol. 1, pp. 12-18.*
M. Chhowalla et al., Two-dimensional semiconductors for transistors, published online Aug. 17, 2016, Nature Reviews|Materials, vol. 1, Nov. 2016, pp. 1-15.*
F. Liu et al., Impact of edge states on device performance of phosphorene heterojunction tunneling field effect transistors, Oct. 5, 2016, Nanoscale, vol. 8, pp. 18180-18186.*
J. Chang & C. Hobbs, Theoretical study of phosphorene tunneling field effect transistors, Feb. 26, 2015, Applied Physics Letters, vol. 106, pp. 083509-1 to 083509-5.*
S. Yu et al., Phase transition, effective mass and carrier mobility of MoS2 monolayer under tensile strain, Nov. 2, 2014, Applied Surface Science, vol. 325, pp. 27-32.*
L. Li et al., Black phosphorus field-effect transistors, Mar. 2, 2014, Nature Nanotechnology, vol. 9, pp. 372-377.*
Machine translation, Lee, Korean Pat. Pub. No. KR 1020070047400, translation date: Jul. 31, 2018, Espacenet, all pages.*
Machine translation, Han, Korean Pat. Pub. No. KR 100459211, translation date: Jul. 31, 2018, Espacenet, all pages.*
Salmani-Jelodar, M., Kim, S., Ng, K. & Klimeck, G., Transistor roadmap projection using predictive full-band atomistic modeling. Appl. Phys. Lett. 105, 083508 (2014).
Zhang, S. et al., Extraordinary photoluminescence and strong temperature/angle-dependent raman responses in few-layer phosphorene. ACS Nano 8, 9590-9596 (2014).
K. Bernstein, R. K. Cavin, W. Porod, A. C. Seabaugh, and J. Welser, Device and architectures outlook for beyond CMOS switches, Proc. IEEE 98, 21692184 (2010).
H. Liu, A. T. Neal, Z. Zhu, Z. Luo, X. Xu, D. Tomanek, and P. D. Ye, Phosphorene: an unexplored 2d semiconductor with a high hole mobility, ACS nano, vol. 8, No. 4, pp. 40334041, (2014).
J. Qiao, X Kong, Z. X. Hu, F. Yang, and W. Ji, High-mobility transport anisotropy and linear dichroism in few-layer black phosphorus, Nature communications, 5 (2014).
Y. Cai, G. Zhang, and Y. W. Zhang, Layer-dependent band alignment and work function of few-layer phosphorene, Scientific reports, 4 (2014).
A. M. Ionescu & H. Riel, Tunnel field-effect transistors as energy-efficient electronic switches. Nature 479, 329-337 (2011).

J. Wang & M. Lundstrom, Does source-to-drain tunneling limit the ultimate scaling of MOSFETs? IEEE, International Electron Devices Meeting, IEDM (2002).
M. Salmani-Jelodar, S. Mehrotra, H. Ilatikhameneh & G. Klimeck, Design Guidelines for Sub-12 nm Nanowire MOSFETs. IEEE Trans. on Nanotechnology 14(2), 210-213 (2015).
J. Appenzeller, Y.-M. Lin, J. Knoch & PH. Avouris, Band-to-band tunneling in carbon nanotube field-effect transistors. Phys. Rev. Lett. 93(19), 196805 (2004).
J. Appenzeller, Y.-M. Lin, J. Knoch, Z. Chen & PH. Avouris, Comparing carbon nanotube transistors—the deal choice: a novel tunneling device design. IEEE Trans. on Electron Dev. 52, 2568-2576 (2005).
J. E. Avci & I. Young, Heterojunction TFET scaling and resonant-TFET for steep subthreshold slope at sub-9 nm gate-length. In IEEE International Electron Devices Meeting (IEDM) 4-3 (2013).
H. Ilatikhameneh, G. Klimeck & R. Rahman, Can Homojunction Tunnel FETs Scale Below 10 nm? IEEE EDL 37(1), 115-118 (2016).
H. Lu & A. Seabaugh, Tunnel Field-Effect transistors: state-of-the-art. IEEE Electron Devices Society 2(4), 44-49 (2014).
Schwierz, F., J. Pezoldt & R. Granzner, Two-dimensional materials and their prospects in transistor electronics. Nanoscale 7(18), 8261-8283 (2015).
H. Ilatikhameneh, R. B. Salazar, G. Klimeck, R. Rahman & J. Appenzeller, From Fowler-Nordheim to Non-Equilibrium Green's Function Modeling of Tunneling. IEEE Transactions on Electron Devices 63(7), 2871-2878 (2016).
E. O. Kane, Zener tunneling in semiconductors. Journal of Physics and Chemistry of Solids 12(2), 181-188 (1960).
H. Liu, A. T. Neal, Z. Zhu, Z. Luo, X. Xu, D. Tomanek & P. D. Ye, Phosphorene: an unexplored 2d semiconductor with a high hole mobility. ACS nano 8(4), 4033-4041 (2014).
J. Qiao, X. Kong, Z. X. Hu, F. Yang & W. Ji., High-mobility transport anisotropy and linear dichroism in few-layer black phosphorus. Nature communications 5 (2014).
T. Krishnamohan, D. Kim, S. Raghunathan & K. Saraswat, Double-Gate Strained-Ge Heterostructure Tunneling FET (TFET) With record high drive currents and subthreshold slope ∥ 60 mV/dec. In IEEE International Electron Devices Meeting IEDM 1-3 (2008).
J. Knoch & J. Appenzeller, Modeling of high-performance p-type IIIV heterojunction tunnel FETs. IEEE Electron Device Letters 31(4), 305-307 (2010).
T. A. Ameen, H. Ilatikhameneh, G. Klimeck & R. Rahman, Few-layer Phosphorene: An Ideal 2D Material for Tunnel Transistors. Scientific reports 6,28515, doi: 10.1038/srep28515 (2016).
H. Ilatikhameneh, Y. Tan, B. Novakovic, G. Klimeck, R. Rahman & J. Appenzeller, Tunnel Field-Effect Transistors in 2D Transition Metal Dichalcogenide Materials. IEEE Exploratory Solid-State Computational Devices and Circuits 1(1), 12-18 (2015).
G. Fiori, F. Bonaccorso, G. Iannaccone, T Palacios, D. Neumaier, A. Seabaugh, S. K. Banerjee & L. Colombo, Electronics based on two-dimensional materials. Nature nanotechnology 9(10), 768-779 (2014).
F. W. Chen, H. Ilatikhameneh, G. Klimeck, Z. Chen & R. Rahman, Configurable Electrostatically Doped High Performance Bilayer Graphene Tunnel FET. IEEE Journal of the Electron Devices Society 4(3), 124-128 (2016).
H. Ilatikhameneh, T. Ameen, G. Klimeck, J. Appenzeller & R. Rahman, Dielectric Engineered Tunnel Field-Effect Transistor. IEEE Electron Device Letters 36(10), 1097-1100, 10.1109/LED. 2012474147 (2015).
J. Qiao et al., High-mobility transport anisotropy and linear dichroism in few-layer black phosphorus. Nature commmunications 5 (2014).
Y. Cai, G. Zhang & Y. W. Zhang, Layer-dependent band alignment and work function of few-layer phosphorene. Scientific reports 4 (2014).
S. Das, W. Zhang, M. Demarteau, A. Hoffmann, M. Dubey & A. Roelofs, Tunable transport gap in phosphorene. Nano letters 14(10), 5733-5739 (2014).

(56) References Cited

OTHER PUBLICATIONS

X. Peng, A. Copple & Q. Wei, Edge effects on the electronic properties of phosphorene nanoribbons. Journal of Applied Physics 116(14), 144301, Oct. 14, 2014.

Q. Wu, L. Shen, M. Yang, Y. Cai, Z. Huang & Y. P. Feng, Electronic and transport properties of phosphorene nanoribbons. Physical Review B 92(3), 035436 (2015).

A. K. A. Lu et al., Origin of the performances degradation of two-dimensional-based metal-oxide-semiconductor field affect transistors in the sub-10 nm regime: A first-principles study. Applied Physics Letters 104, 043504 (2016).

M. Luisier & G. Klimeck, Simulation of nanowire tunneling transistors: From the WentzelKramersBrillouin approximation to fullband phonon-assisted tunneling. Journal of Applied Physics 107(8), 084507 (2010).

Ionescu, A. M. & Riel, H., Tunnel field-effect transistors as energy-efficient electronic switches. Nature 479, 329-337 (2011).

Sarkar, D. et al., A subthermionic tunnel field-effect transistor with an atomically thin channel. Nature 526, 91-95 (2015).

Choi, W. Y., Park, B.-G., Lee, J. D. & Liu, T.-J. K., Tunneling field-effect transistors (tfets) with subthreshold swing (ss) less than 60 mv/dec. IEEE Electron Device Lett. 28, 743-745 (2007).

Nikonov, D. & Young, I., Benchmarking of beyond-cmos exploratory devices for logic integrated circuits. IEEE J. Explor. Solid-State Computat. Devices Circuits 1, 3-11 (2015).

Liu, H. et al., Phosphorene: an unexplored 2d semiconductor with a high hole mobility. ACS Nano 8, 4033-4041 (2014).

Zhang, Q., Iannaccone, G. & Fiori, G., Two-dimensional tunnel transistors based on Bi2Se3 thin film. IEEE Electron Device Lett. 35, 129-131 (2014).

Ilatikhameneh, H., Salazar, R. B., Klimeck, G., Rahman, R. & Appenzeller, J., From fowler-nordheim to non-equilibrium green's function modeling of tunneling. IEEE Trans. on Elect. Dev. (TED), doi: 10.1109/TED.2012565582 (2016).

Castellanos-Gomez, A. et al., Isolation and characterization of few-layer black phosphorus. 2D Materials 1, 025001 (2014).

Kou, L., Chen, C. & Smith, S. C., Phosphorene: Fabrication, properties, and applications. J. Phys. Chem. Lett. 6, 2794-2805 (2015).

Na, J. et al., Few-layer black phosphorus field-effect transistors with reduced current fluctuation. ACS Nano 8, 11753-11762 (2014).

\* cited by examiner

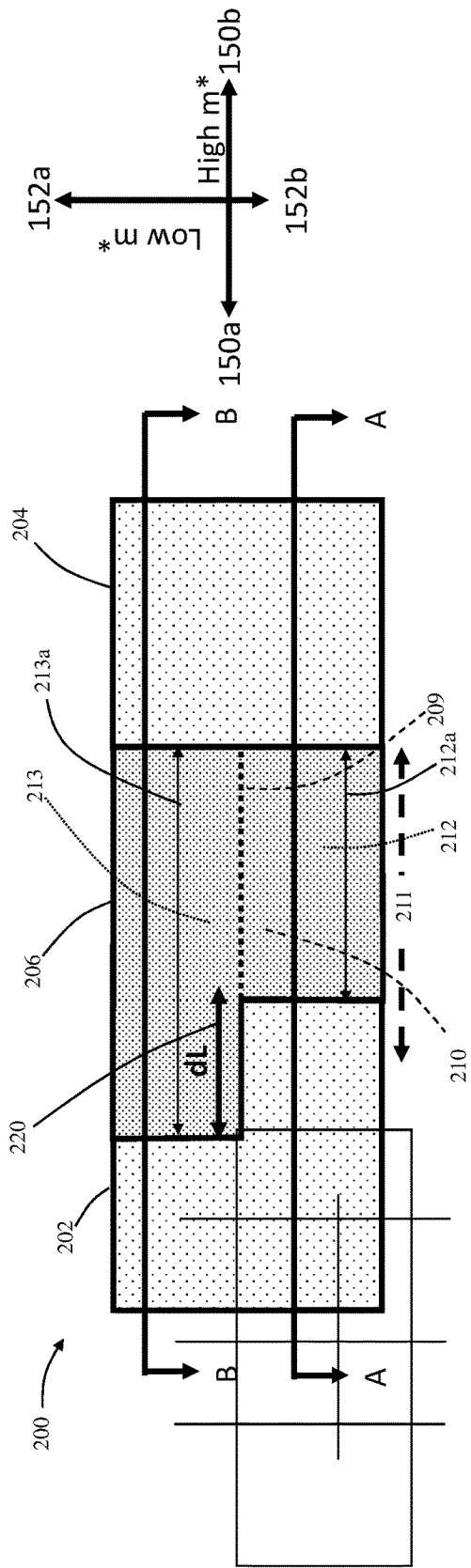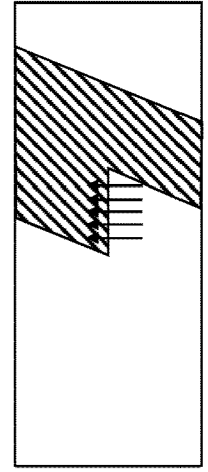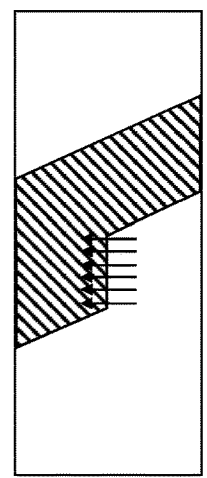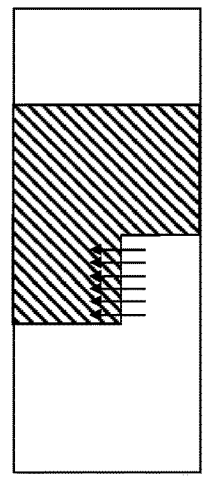

TUNNEL FIELD EFFECT TRANSISTOR HAVING ANISOTROPIC EFFECTIVE MASS CHANNEL

CROSS-REFERENCE TO RELATED APPLICATIONS

The present application is related to and claims the benefit of U.S. Prov. Pat. App. No. 62/317,835, filed Apr. 4, 2016, the contents of which are hereby incorporated by reference in its entirety into this disclosure.

STATEMENT REGARDING GOVERNMENT FUNDING

This invention was made with government support under 2013-MA-2382 awarded by the Defense Advanced Research Projects Agency. The government has certain rights in the invention.

TECHNICAL FIELD

The present application relates to electronic switching devices, and more specifically, to a field effect transistor having a channel with anisotropic effective mass.

BACKGROUND

Electronic industry development has been faithful to Moore's law as devices are becoming smaller and the number of transistors larger. For example, in 1980, INTEL's 8086 had about 50,000 transistors; in 1990, 486 had about 1,000,000 transistors; in 2000, PENTIUM4 had about 50,000,000 transistors; and in 2010, SIX-CORE 17 had about 1,000,000,000 transistors. There are two significant challenges with this ever-increasing transistor count. First, a central challenge of the electronic industry is power consumption of integrated circuits which are now composed of billions of transistors. Second, as the channel length of transistors (e.g., metal oxide semiconductors field effect transistor, MOSFET) is becoming smaller and smaller in order to increase both the operation speed and the number of transistors per chip, a phenomenon referred to as a short channel effect (SCE) becomes prominent. SCE specifically becomes problematic when the channel length is of the same order of magnitude as the depletion-layer widths. SCE manifest itself in several ways including: a subthreshold voltage roll-off (Vt roll-off), a drain-induced barrier lowering (DIBL) and a source-drain punch through, thus increasing the inverse subthreshold slope of metal oxide semiconductor field effect transistor (MOSFET) and thereby significantly increasing off-state leakage current. Particularly, with off-state leakage as a measure of power performance, MOSFETs performance deteriorate progressively in submicron, deep submicron, and nano-scale channel lengths. Additionally, MOSFETs are fundamentally unable to have sharp ON-to-OFF transition, which implies that they need a relatively large operating voltage to supply the needed ON current to operate. Furthermore, the higher the desired operating speed (i.e. frequency of ON to OFF transitions), the higher the needed ON current and consequently the higher the supply voltage, hence the power consumption problem is further exacerbated. Accordingly, it is essential to reduce the power consumption in chips with large numbers of transistors especially those operating at high frequencies. Therefore, a main challenge in miniaturizing MOSFETs is scaling down the supply voltage $V_{DD}$, as needed to reduce power. A smaller $V_{DD}$ can be achieved in a switch with sharper ON to OFF transition. However, the steepness of conventional MOSFETs have a fundamental limit due to thermionic injection of carriers over the channel barrier (60 mV/decade at room temperature). The cause of this limit is also referred to as a hot carrier leakage.

Devices known as tunnel field effect transistors (TFETs) have been introduced in an attempt to address these issues. The hot carrier leakage problem does not exist in the tunnel FETs, which work based on injection of cold carriers. The doping profile of TFETs is P-i-N, unlike MOSFETs which typically use an N-i-N or P-i-P profile. Hence, the bandgap of a TFET filters out the hot carriers. TFETs are able to provide steep ON-to-OFF transitions allowing them to operate at lower voltages and significantly reduce the power consumption. However, one challenge of conventional TFETs is that the tunneling transmission probability is small, which results in small ON current levels and low speed. Moreover, scaling the channel length below 10 nm in conventional TFETs is shown to be exceedingly challenging as further length scaling significantly degrades OFF-state of conventional TFETs. Given these challenges, the Moore's law appears to be at a dead-end.

Therefore, there is an unmet need for a novel TFET design that improves upon conventional TFET current performance both in the ON- and OFF-states.

SUMMARY

A tunnel field effect transistor (TFET) device is disclosed. The TFET includes a substrate, and heavily doped source and drain regions disposed at opposite ends of the substrate separated by a channel region, where the channel region can be intrinsic or lightly doped with doping of less than $10^{18}/cm^3$ and the source and drain regions doped with doping of between about $10^{18}/cm^3$ to about $10^{21}/cm^3$ forming a PiN or NiP structure. The TFET further includes a gate terminal separated from the channel region by a dielectric layer, and source and drain terminals coupled to the source and drain regions, respectively. The channel region includes a channel material with a first effective mass along a longitudinal axis extending from the source region to the drain region and a second effective mass along a lateral axis perpendicular to the longitudinal axis.

A tunnel field effect transistor (TFET) device is disclosed. The TFET includes a substrate and heavily doped source and drain regions disposed at opposite ends of the substrate separated by a channel region, where the channel region can be intrinsic or lightly doped with doping of less than $10^{18}/cm^3$ and the source and drain regions doped with doping of between about $10^{18}/cm^3$ to about $10^{21}/cm^3$ forming a PiN or NiP structure. The TFET further include a source and drain terminal coupled to the source and drain regions, respectively. The channel region includes a first substantially parallelogram portion having a first length defined along a longitudinal axis extending from the source region to the drain region and a second substantially parallelogram portion connected to the first substantially parallelogram portion having a second length defined along the longitudinal axis and larger than the first length, the TFET device having an effective channel length defined along the longitudinal axis that is an average of the first and second lengths.

BRIEF DESCRIPTION OF DRAWINGS

In the following description and drawings, identical reference numerals have been used, where possible, to designate identical features that are common to the drawings.

FIG. 3 is a top view of an exemplary TFET, according to one embodiment of the present disclosure, showing two section lines A-A and B-B.

FIGS. 3A, 3B, and 3C are schematics that show parallelogram channel sections including an L-shaped section (FIG. 3A), a first V-shaped section (FIG. 3B), and a second V-shaped section (FIG. 3C).

DETAILED DESCRIPTION

Figure 1:
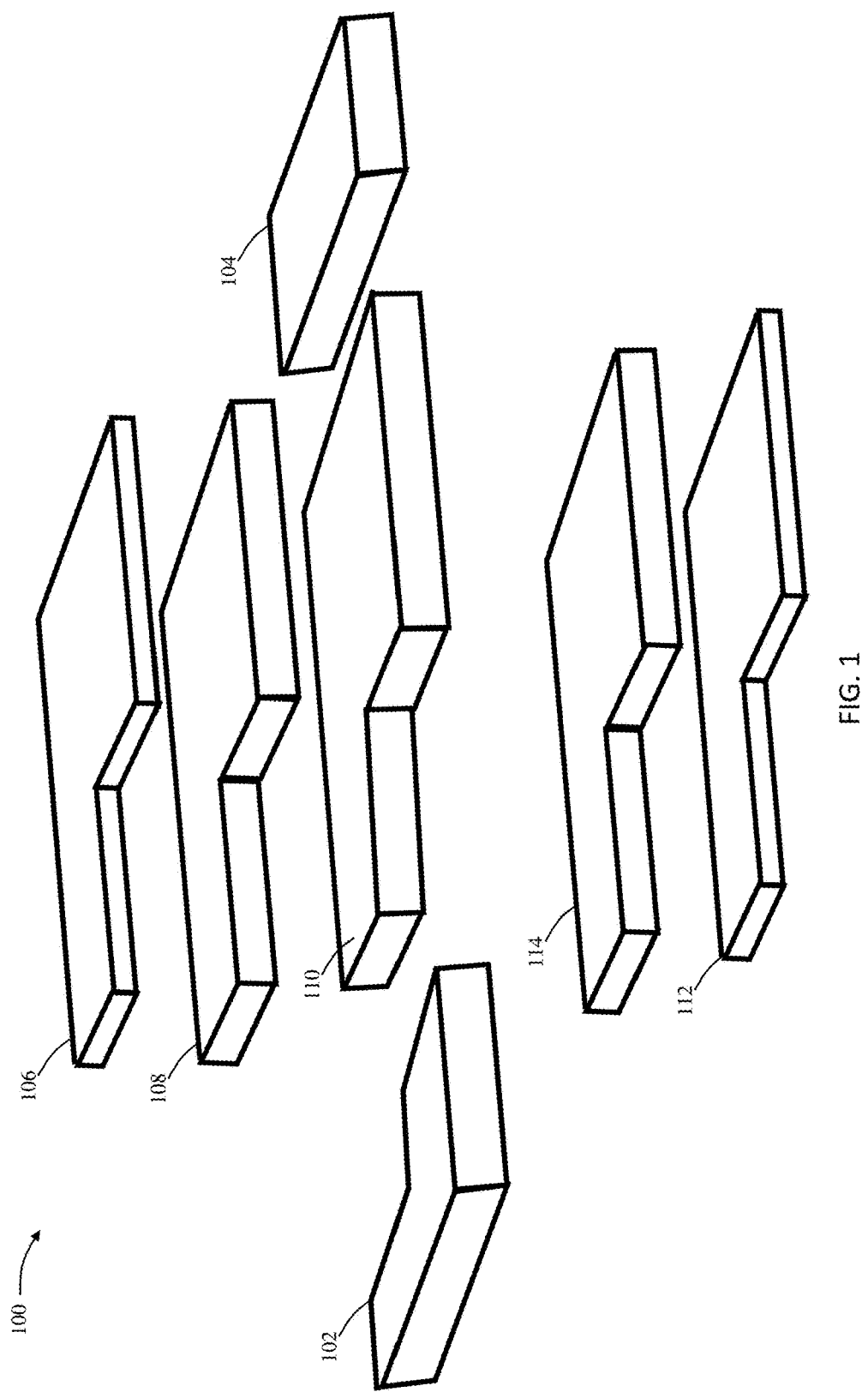
FIG. 1 is a perspective exploded schematic view of a tunnel field effect transistors (TFET), according to one embodiment of the present disclosure.

In the following description, some aspects will be described in terms that would ordinarily be implemented as software programs. Those skilled in the art will readily recognize that the equivalent of such software can also be constructed in hardware, firmware, or micro-code. Because data-manipulation algorithms and systems are well known, the present description will be directed in particular to algorithms and systems forming part of, or cooperating more directly with, systems and methods described herein. Other aspects of such algorithms and systems, and hardware or software for producing and otherwise processing the signals involved therewith, not specifically shown or described herein, are selected from such systems, algorithms, components, and elements known in the art. Given the systems and methods as described herein, software not specifically shown, suggested, or described herein that is useful for implementation of any aspect is conventional and within the ordinary skill in such arts.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

In the present disclosure, the term "about" can allow for a degree of variability in a value or range, for example, within 10%, within 5%, or within 1% of a stated value or of a stated limit of a range.

In the present disclosure, the term "substantially" can allow for a degree of variability in a value or range, for example, within 90%-100%, within 95%-105%, or within 99%-101% of a stated value or of a stated limit of a range.

A novel TFET design that improves upon conventional TFET in both the ON- and OFF-states is presented. Referring to FIG. 1, a perspective exploded schematic view of a tunnel field effect transistors (TFET) 100, according to one embodiment of the present disclosure is provided. The TFET 100 includes one or optionally two L-shaped gates (shown as a top gate 106 and optionally a bottom gate 112), a channel 110 (a channel is also referred to as a channel region throughout the present disclosure) disposed below the top gate 106, and source and drain regions 102 and 104, respectively (source and drain regions are also referred to as source and drain, respectively, throughout the present disclosure) at opposing ends of the channel 110. The channel region 110 can be intrinsic or lightly doped with doping of less than $10^{18}/cm^3$ and the source and drain regions doped with doping of between about $10^{18}/cm^3$ to about $10^{21}/cm^3$, collectively forming a structure wherein the structure is PiN or NiP, where "i" refers to intrinsic or lightly doped N or P. The top gate 106 is separated from the channel 110 by gate oxide 108. Similarly, if the TFET includes two gates (i.e., a bottom gate 112), then bottom gate 112 is separated from the channel 110 by gate oxide 114. Exemplary gate oxide materials include $HfO_2$, $SiO_2$, $Al_2O_3$, and other gate oxide known to a person having ordinary skill in the art. The gate typically comprises a conductive contact layer made from, e.g., Al, Cu, a transition metal such as nickel, a refractory metal such as tungsten, and metal silicides such as $TiSi_2$, $MoSi_2$, and $WSi_2$, a material comprised of a combination of these layers, or other conductive material known to a person having ordinary skill in the art. The source and drain regions of the device may also include conductive contacts made from, e.g., Al, Cu, a transition metal such as nickel, a refractory metal such as tungsten, and metal silicides such as $TiSi_2$, $MoSi_2$, and $WSi_2$, a material comprised of a combination of these layers, or other conductive material known to a person having ordinary skill in the art for attaching external circuitry to the TFET 100.

Figure 2:
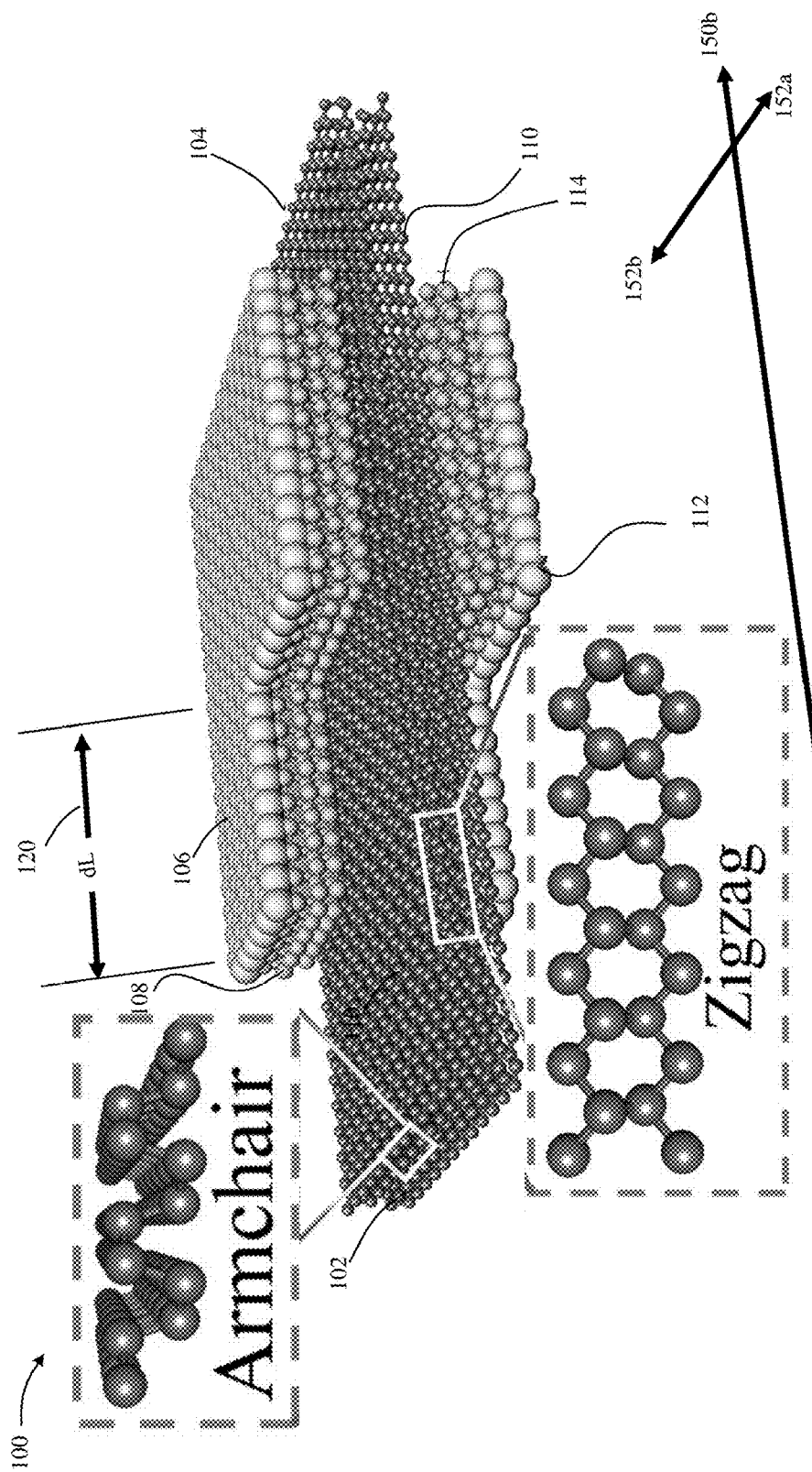
FIG. 2 is a perspective schematic view of the TFET of FIG. 1.

The channel 110 comprises a material having anisotropic effective mass. Referring to FIG. 2, a perspective schematic view of the TFET 100 of FIG. 1 is provided. As shown in FIG. 2, the channel 110 comprises a material that has a high effective mass (high m*) along a longitudinal axis 150a-150b of the device defined from the source 102 to the drain 104 (i.e., from left to right). Conversely, the material of the channel 110 in a lateral axis 152a-152b from right to left (or bottom to top in, e.g., FIG. 3 described more fully below which is a top view of a device according to the present disclosure), the channel material has a relatively lower effective mass (low m*). The ratio between high m* and low m* can be between 1 and 50. The boundary between the source 102 and the channel 110 of the illustrated L-shaped gate TFET 100 (also herein referred to as the L-gate TFET) has an elongated portion 120 which is generally perpendicular to the low effective mass axis 152a-152b and is labeled as having a length dL in FIG. 2. In one embodiment, the channel material comprises a two-layer (2L) phosphorene nanoribbon having a zigzag structure in the high m* direction (i.e., along the longitudinal axis 150a-150b) and an armchair structure in the low m* direction (i.e., along the lateral axis 152a-152b), although other materials having anisotropic effective mass characteristics may also be used (e.g., Silicon, Germanium, and 2D materials such as titanium trisulfide ($TiS_3$)). While the zigzag and the armchair atomistic structures are formed inherently by using phosphorene as a channel material, other materials generating differing effective mass (i.e., high m* and low m*) can also be used in which case, the structure may not be the same as zigzag and armchair. The ratio of high m* to low m* according to the present disclosure is between 1-50. In general, the channel region 110 includes one or more layers of i) 2-dimensional inherently anisotropic material made from phosphorene, titanium trisulfide, or any combination thereof; ii) 2-dimensional inherently isotropic material made from transition metal dichalcogenide including molybdenum disulfide, tungsten disulfide, molybdenum diselenide, tungsten diselenide, molybdenum ditelluride, or any combination thereof; iii) 3-dimensional bulk material made from Si, germanium, gallium arsenide (GaAs), an alloy of silicon and germanium, indium phosphide, or any combination thereof, wherein the 2-dimensional inherently isotropic material and the 3-dimensional bulk material are formed to induce the first effective mass and the second effective mass by either being placed in a strained state, by structurally being formed in a manner that results in effective masses substantially different in the longitudinal and lateral axes, or by other methods known to a person having ordinary skill in the art.

Referring to FIG. 3, a top view of an exemplary TFET 200 is depicted. The TFET 200 includes an L-shaped gate 206 (top gate), a channel region 210 (below the top gate 206 and therefore shown as dashed lines) having an effective length 211, which is disposed below the top gate 206, and source and drain regions (202 and 204, respectively) at opposing ends of the channel 210. The channel region 210 includes a first substantially rectangular (or parallelogram) portion 212 having a first length 212a defined along the longitudinal axis 150a-150b extending from the source region 202 to the drain region 204 and a second substantially rectangular (or parallelogram) portion 213 having a second length 213a defined along the longitudinal axis 150a-150b which is larger than the first length 212a. The first and second substantially rectangular (or parallelogram) portions 212 and 213, respectively, are separated by an imaginary line 209. The TFET 200 defines an effective channel length 211 along the longitudinal axis 150a-150b that is an average of the first and second lengths 212a and 213a, respectively. The top gate 206 is separated from the channel 210 by a layer of gate oxide (not shown). Two section lines A-A and B-B are provided to show the structures of the TFET 200 across its layers in FIGS. 4 and 5, respectively.

While an L-shaped channel is depicted in the figures of the present disclosure, it should be appreciated the present disclosure is not limited to L-shaped structures. In general, the channel region includes a first substantially parallelogram portion (e.g., 212) with a first length (e.g., 212a) defined along the longitudinal axis (150a-150b) and a second substantially parallelogram portion (e.g., 213) connected to the first substantially parallelogram (e.g., 212) portion with a second length (e.g., 213a) defined along the longitudinal axis (150a-150b) and larger than the first length (e.g., 212a), where the TFET device has an effective channel length defined along the longitudinal axis that is an average of the first and second lengths. The structures can include L-shaped structures, V-shaped structures, and other geometrical structure combinations.

Referring to FIGS. 3A, 3B, and 3C top view schematics are provided that show parallelogram channel sections including an L-shaped section (FIG. 3A), a first V-shaped section (FIG. 3B), and a second V-shaped section (FIG. 3C).

Figure 4:
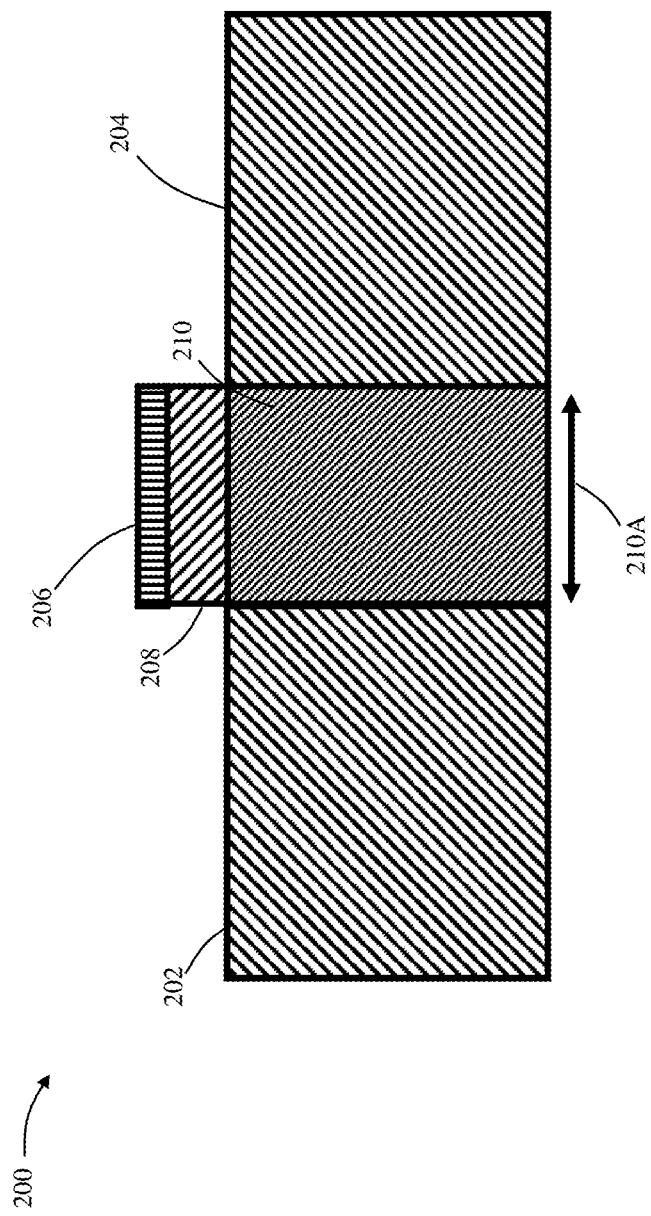
FIG. 4 is a cross-sectional view of a cross section about section line A-A of FIG. 3.

Referring to FIG. 4, a cross sectional view of a cross section about section line A-A of FIG. 3 is provided. Shown in FIG. 4 is also a gate oxide 208, insulating the gate 206 from the channel 210. The channel 210 has a width 210A which is smaller than the width 210B (see FIG. 5) by the amount dL 220 (shown in FIG. 3).

Figure 5:
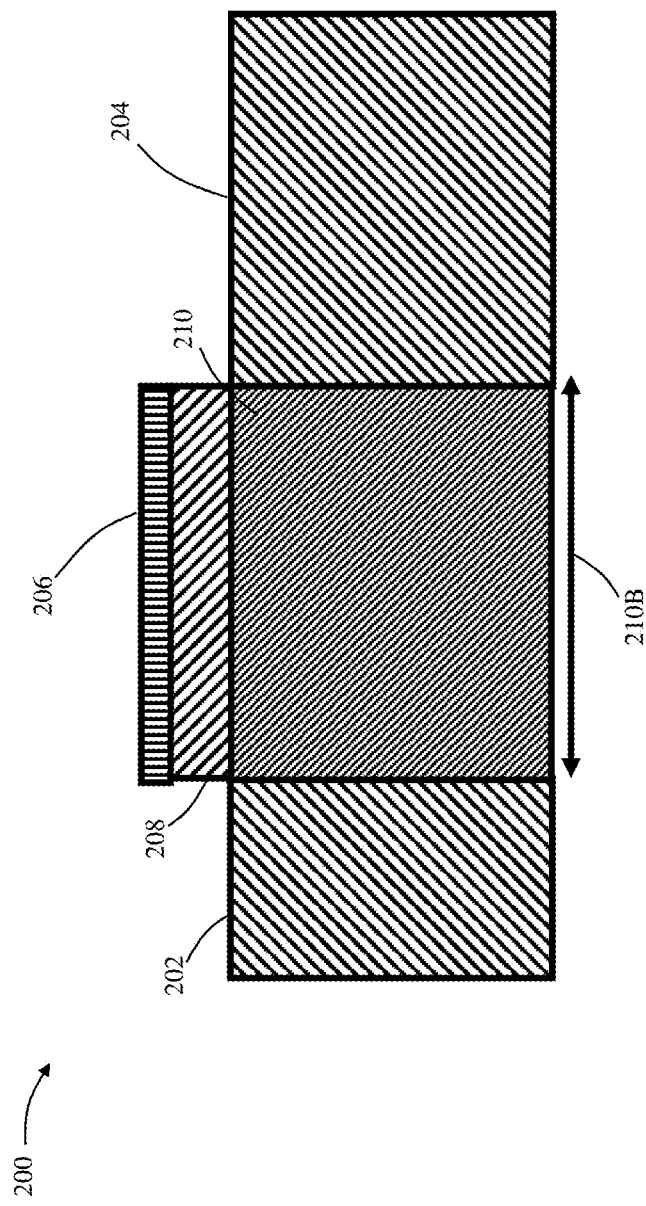
FIG. 5 is a cross sectional view of a cross section about section line B-B of FIG. 3.

Referring to FIG. 5, a cross sectional view of a cross section about section line B-B of FIG. 3 is provided. Shown in FIG. 5 is also a gate oxide 208, insulating the gate 206 from the channel 210. The channel 210 has a width 210B which is larger than the width 210A (see FIG. 4) by the amount dL 220 (shown in FIG. 3).

Figure 6:
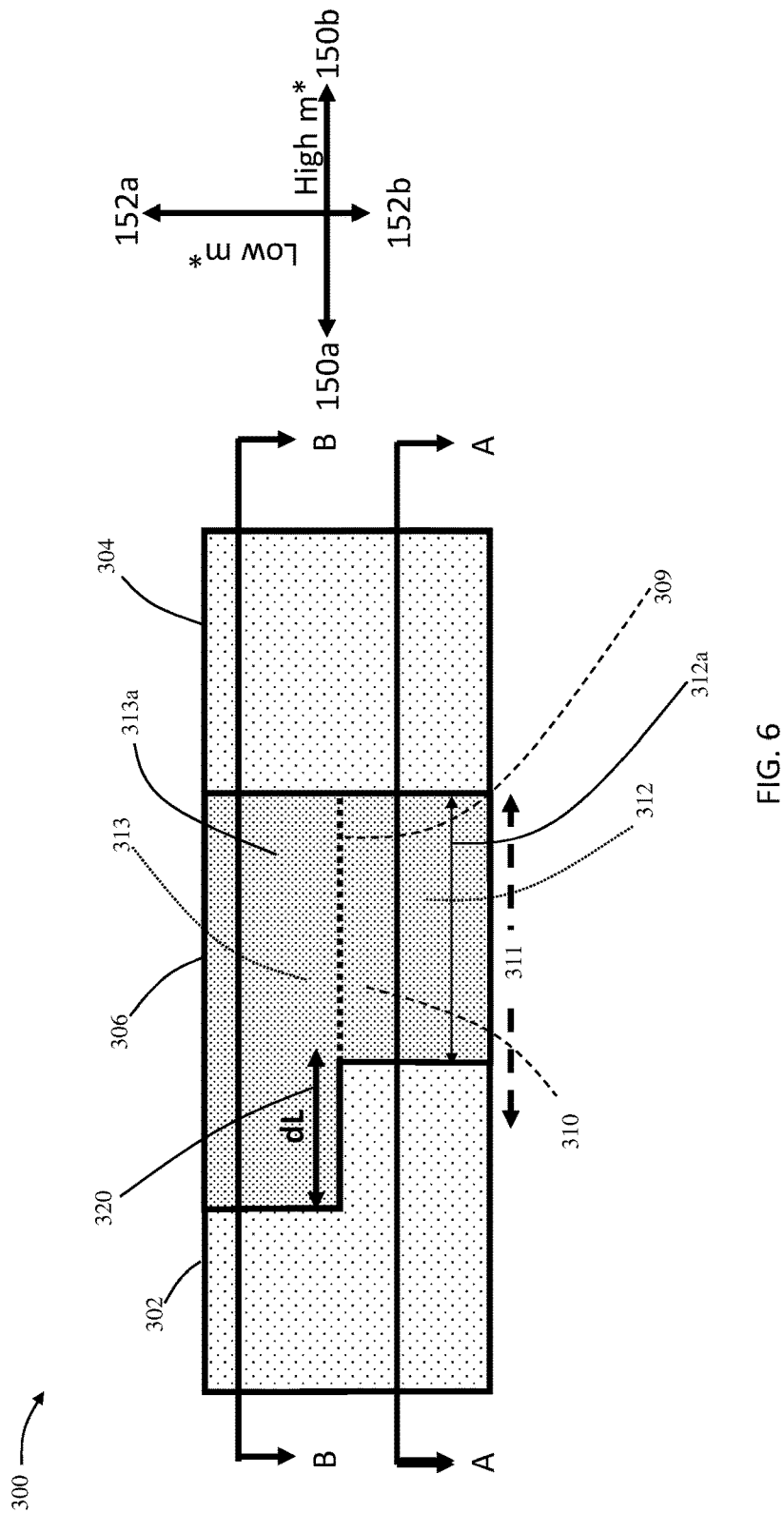
FIG. 6 is a top view of an exemplary double-gated TFET, according to one embodiment of the present disclosure, showing two section lines A-A and B-B.
Figure 7:
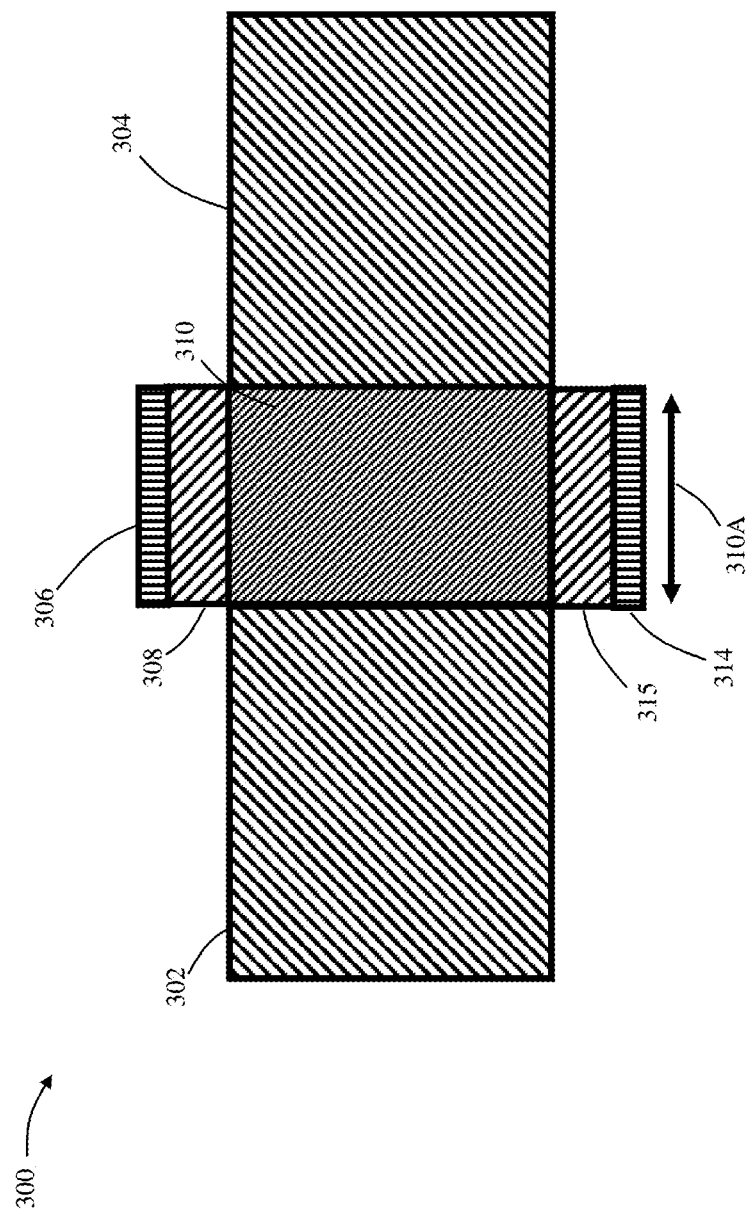
FIG. 7 is a cross-sectional view of a cross section about section line A-A of FIG. 6.
Figure 8:
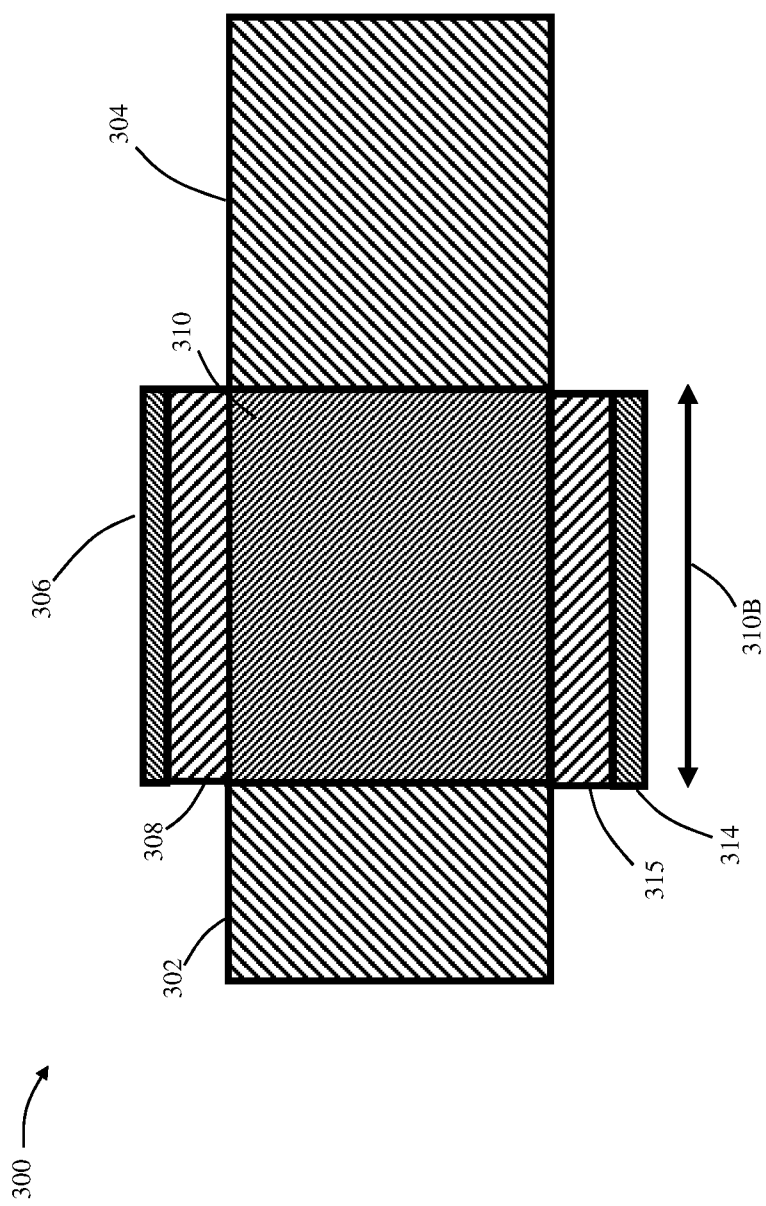
FIG. 8 is a cross sectional view of a cross section about section line B-B of FIG. 6.

Referring to FIG. 6, a top view of an exemplary double-gated TFET 300 is depicted. The TFET 300 includes an L-shaped gate 306 (top gate is shown in FIG. 6, and a bottom gate is also shown in FIGS. 7 and 8), a channel region 310 (below the top gate 306 and therefore shown as dashed lines) having an effective length 311, which is disposed below the top gate 306, and source and drain regions (302 and 304, respectively) at opposing ends of the channel region 310. The channel region 310 includes a first substantially rectangular (or parallelogram) portion 312 having a first length 312a defined along the longitudinal axis 150a-150b extending from the source region 302 to the drain region 304 and a second substantially rectangular (or parallelogram) portion 313 having a second length 313a defined along the longitudinal axis 150a-150b which is larger than the first length 312a. The first and second substantially rectangular (or parallelogram) portions 312 and 313, respectively, are separated by an imaginary line 309. The TFET 300 defines an effective channel length 311 along the longitudinal axis 150a-150b that is an average of the first and second lengths 312 and 313, respectively. The top gate 306 is separated from the channel 310 by a layer of gate oxide (not shown). Two section lines A-A and B-B are provided to show the structures of the TFET 300 across its layers in FIGS. 7 and 8, respectively.

Referring to FIG. 7, a cross sectional view about section line A-A of FIG. 6 is provided. Shown in FIG. 7 is also a gate oxide 308 disposed below the top gate 306, insulating the top gate 306 from the channel 310. Also, shown in FIG. 7 is a bottom gate 314 and a gate oxide 315 disposed above the bottom gate 314. The channel 310 has a width 310A which is smaller than the width 310B (see FIG. 5) by the amount dL 320 (shown in FIG. 3).

Referring to FIG. 8, a cross sectional view about section line B-B of FIG. 6 is provided. Shown in FIG. 8 is also a gate oxide 308 disposed below the top gate 306, insulating the top gate 306 from the channel 310. Also, shown in FIG. 8 is the bottom gate 314 and the gate oxide 315 disposed above the bottom gate 314. The channel 310 has a width 310B which is larger than the width 310A (see FIG. 7) by the amount dL 320 (shown in FIG. 3).

TFETs generally have reduced power consumption as compared to MOSFETs, however scaling TFET dimensions below 10 nm is more challenging than the MOSFET since the ON-state and OFF-state tunneling currents ($I_{ON}$ and $I_{OFF}$) of a TFET depend on the same device parameters.

Thus, an effort to decrease $I_{OFF}$ would typically reduce $I_{ON}$. However, in the novel arrangement of the present disclosure, $I_{OFF}$ and $I_{ON}$ are decomposed. Roughly, the ON/OFF ratio of a TFET according to the present disclosure depends on:

$$\log\left(\frac{I_{ON}}{I_{OFF}}\right) \propto L_{ch}\sqrt{m_{r1}^* E_{g1}} - \Lambda\sqrt{m_{r2}^* E_{g2}} \quad (1)$$

where $\Lambda$ and $L_{ch}$ are the tunneling distances in the ON-state (i.e., the tunneling distance defined by the valence band in the source region and the conduction band in the channel region) and OFF-state (i.e., the tunneling distance defined by the valence band of the source region and the conduction band in the drain region) respectively; and $m_{r1}^*$ and $E_{g1}$ are the effective mass and the bandgap of the channel material along the weakest tunneling barrier in the OFF state which is the high m* direction, while $m_{r2}^*$ and $E_{g2}$ are the effective mass and the bandgap along the weakest tunneling barrier in the ON state which is the low m* direction. In one embodiment, according to the present disclosure, $E_{g1}$ and $E_{g2}$ are equal. In another embodiment, according to the present disclosure $E_{g1}$ and $E_{g2}$ are different. For conventional TFETs (i.e., those not having anisotropic effective mass) the transports in both ON and OFF cases in general would experience the same effective mass. For a TFET with a homogenous material that is not made from a hetero-structure, the energy gap is also the same in both directions. Therefore, for conventional TFETs, the first and $2^{nd}$ terms of equation (1) under the square roots would be close and $I_{ON}/I_{OFF}$ ratio small. However, equation (1) is applicable for situations where the channel region as described below is to have different and selective effective masses (and bandgaps) along the two major axes for an L-shaped channel region or other geometrical choices.

Figure 9:
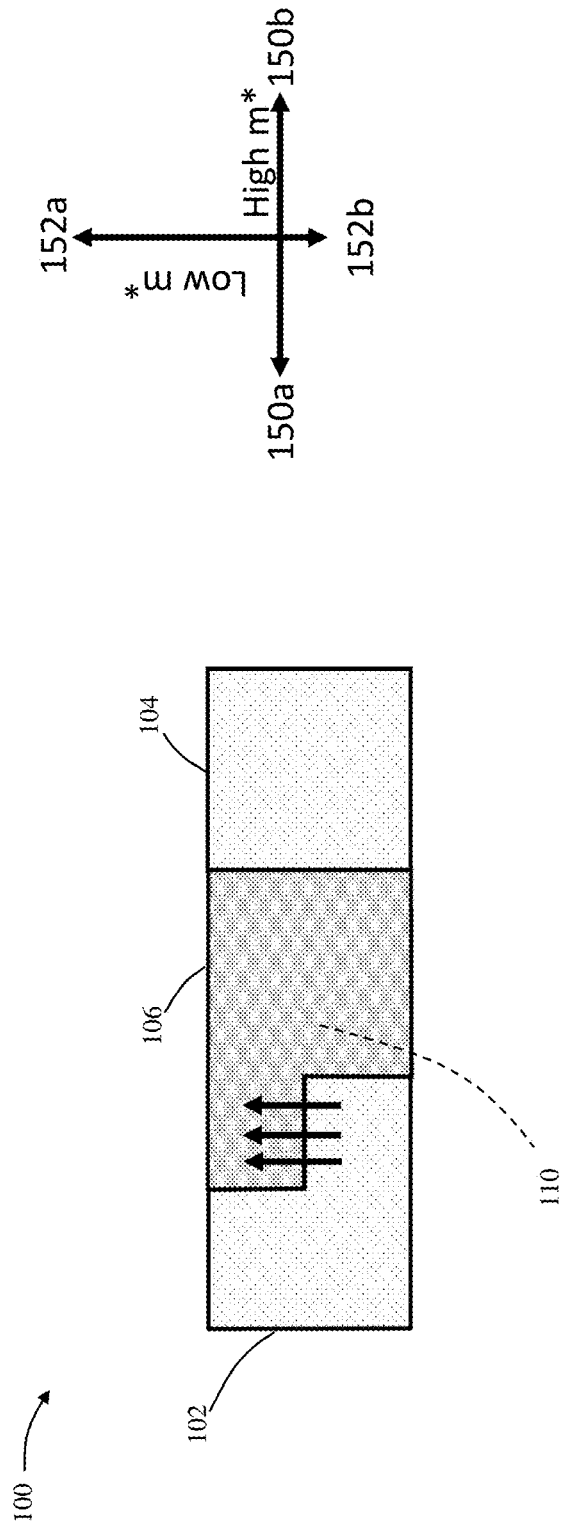
FIG. 9 is a top view schematic of a TFET according to the present disclosure emphasizing the direction of the tunneling current along the weakest tunneling barrier in the ON-state.

The L-gate TFET of the present disclosure provides differing effective mass values for $m_{r1}^*$ and $m_{r2}^*$ (and therefore improved performance) as follows. Referring to FIG. 9, a top view schematic of the TFET 100 is shown again in the ON-state. In the ON-state, when a voltage is applied to the gate 106 the potential energy in the channel region is reduced such that the primary barrier of the cold carriers is the source 102 to channel junction. Because of the L-shape of the gate 106, additional carrier tunneling can occur in the low m* direction (along the lateral axis 152a-152b (see FIG. 2) of the TFET 100) as indicated by the vertical arrows shown in FIG. 9. This additional tunneling is much greater than tunneling which would otherwise be limited to that in the high m* direction (along the longitudinal axis 150a-150b (see FIG. 2) from source 102 to drain 104 of the TFET 100). In this way, $I_{ON}$ is significantly increased.

Figure 10:
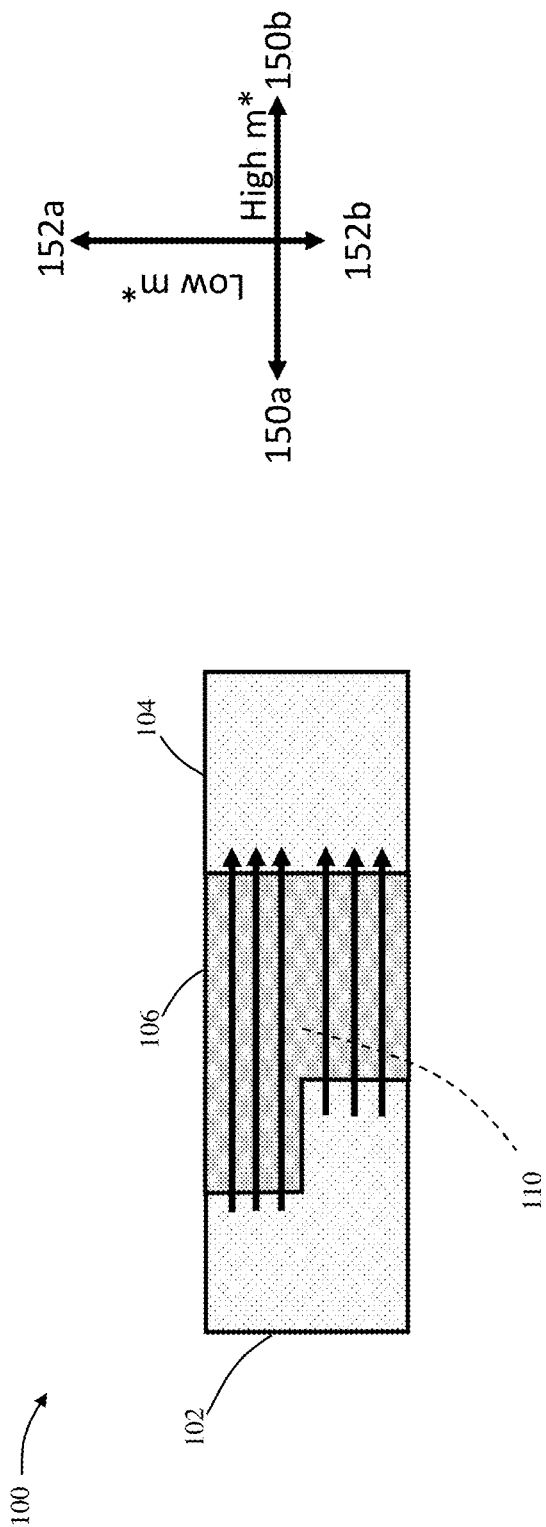
FIG. 10 is a top view schematic of the TFET of FIG. 9 but emphasizing the direction of tunneling current along the weakest tunneling barrier in the OFF-state.

Referring to FIG. 10, a top view schematic of the TFET 100 is shown again in the OFF-state. $I_{OFF}$ is also reduced, since in the OFF-state the main barrier of the carriers is the full channel region 110 itself (between the source 102 and drain 104), and the anisotropic channel material has a higher effective mass along the longitudinal axis 150a-150b (see FIG. 2) from source 102 to drain 104 of the TFET 100. This higher effective mass reduces tunneling in the OFF-state (as shown by the arrows in FIG. 10), and likewise reduces $I_{OFF}$. In the OFF-state, there is some tunneling of carriers through the perpendicular portion of the source-channel barrier, but this is mostly irrelevant to $I_{OFF}$ since the full channel itself is the tunneling barrier and the dominating factor.

Figure 11:
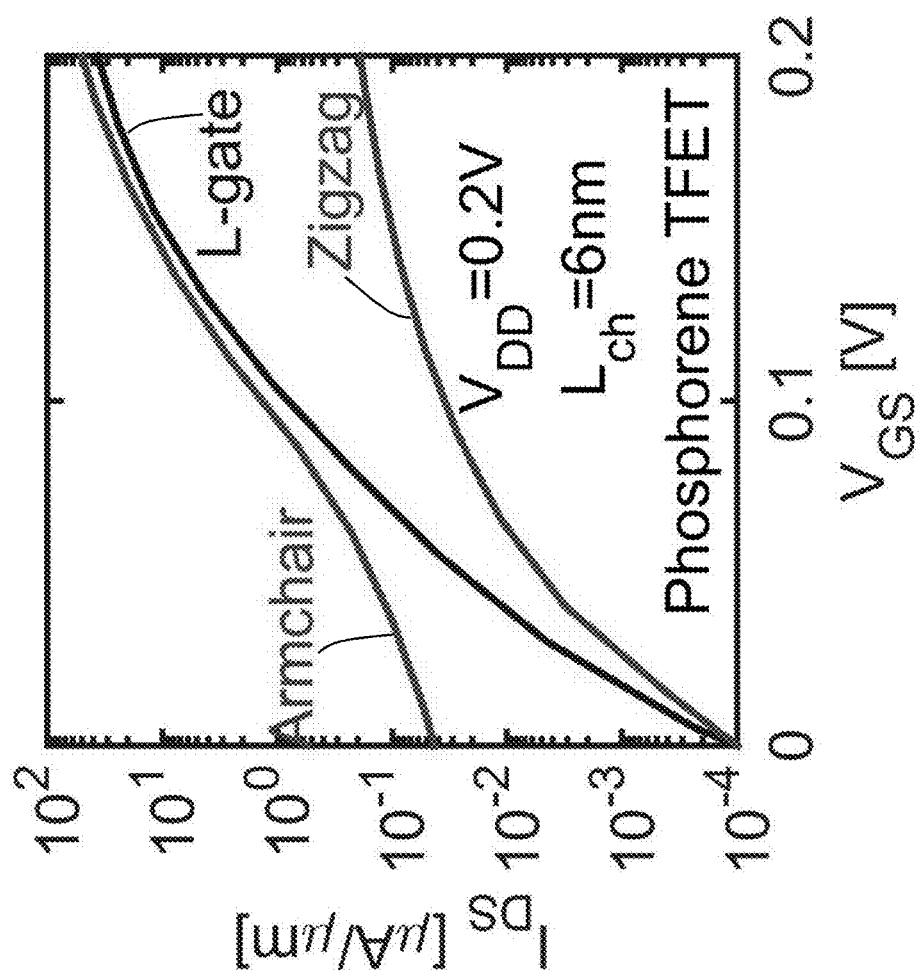
FIG. 11 is a graph of $I_{DS}$ (drain to source current: a measure of transistor's ON vs. OFF performance) as a function of $V_{GS}$ (gate to source voltage) for various arrangements.

Referring back to FIG. 2, the atomic arrangement resulting in differing effective mass values $m_{r1}^*$ and $m_{r2}^*$, described above, is based on two arrangements. In one arrangement in the "Low m*" direction (i.e., in the direction of lateral axis 152a-152 of the TFET 100) the atomic arrangement is shown as an armchair arrangement. Conversely, the second arrangement in the "High m*" direction (i.e., in the direction of longitudinal axis 150a-150b of the TFET 100) the atomic arrangement is shown as zigzag arrangement. Referring to FIG. 11, a graph of $I_{DS}$ (drain to source current: a measure of transistor's ON vs. OFF performance) is shown as a function of $V_{GS}$ (gate to source voltage) for various arrangements. These arrangements include inventors' own work for phosphorene without L-shaped channel showing 6 nm as too small of channel length as the ON-OFF current ratio for two experiments wherein the transport direction is first along the zigzag direction and second along the armchair direction each producing $I_{ON}/I_{OFF}$ ratio less than $10^4$ which is a typical rule of thumb characteristic for an acceptable FET (9 nm was found to be the minimum channel length compliant with that rule of thumb). Further shown in FIG. 11 is the L-shaped channel according to the present disclosure with phosphorene as the channel material producing unexpected results where 6 nm channel length produced an $I_{ON}/I_{OFF}$ ratio of about $4 \times 10^5$ as more clearly shown in FIG. 14, described further below. As shown, the L-shaped channel has an $I_{ON}$ about that of the $I_{ON}$ of a regular-shaped channel TFET device (i.e., no L-shaped channel) which is tailored to have maximum transport along the armchair direction (low m*) but which has a relatively high $I_{OFF}$, but also has an $I_{OFF}$ about that of the $I_{OFF}$ of the same regular-shaped channel device (i.e., no L-shaped channel) which is tailored to have minimum transport along the zigzag direction (high m*) but which has a relatively low $I_{ON}$. Hence, the presently-disclosed L-gate TFET has the advantages of both low and high m* regular-shaped channel devices maximized for high $I_{ON}$ and minimized for low $I_{OFF}$, simultaneously. In FIG. 11, the dL of the channel is about 3 nm.

Figure 12:
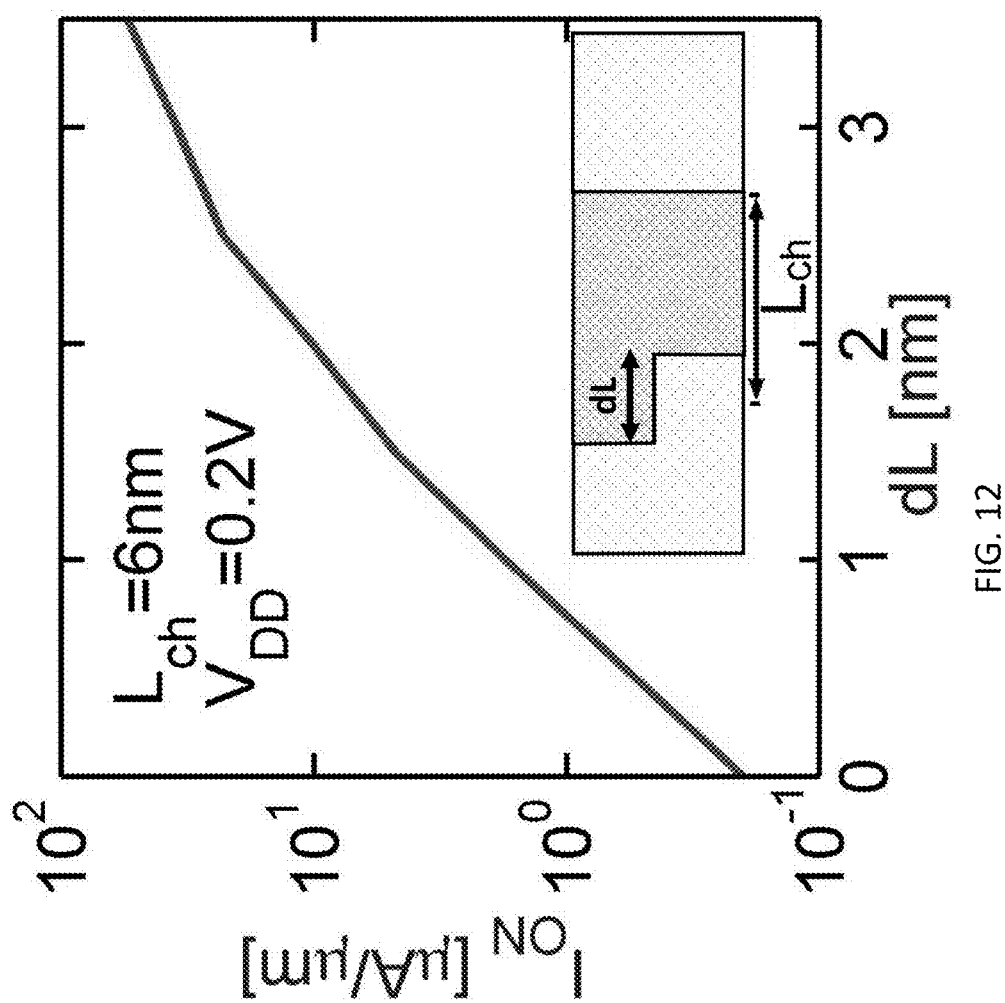
FIG. 12 is a graph of $I_{ON}$ (drain to source current: a measure of transistor's ON performance) measured in µA/µm vs. dL (the difference between a second length of a second substantially rectangular (or parallelogram) portion of a channel region defined along a longitudinal axis extending from a source region to a drain region and a first length of a first substantially rectangular (or parallelogram) portion defined along the longitudinal axis smaller than the second length) measured in nm.

The performance of the L-gate TFET of the present disclosure is dependent on the differential length of the L-shaped channel (dL as shown in FIG. 3 or 6). Referring to FIG. 12, a graph of $I_{ON}$ measured in µA/µm vs. dL measured in nm is provided. The performance of the L-gate TFET depends on the length dL which determines the width for the device ON-current ($I_{ON}$: the maximum current of the transistor) to flow through. In conventional prior-art TFETs, dL equals 0. FIG. 12 shows $I_{ON}$ of one example of the presently disclosed L-gate TFET device as a function of dL for a fixed $I_{OFF}$ of $10^{-4}$ µA/µm. Increasing dL enhances $I_{ON}$ significantly, however it reduces the source extension by dL/2. Accordingly, there is a limit on dL according to the footage requirements in the design. Nevertheless, in the illustrated example, a dL of about 2.5 nm can improve the performance of the TFET by approximately 2 orders of magnitude.

Figure 13:
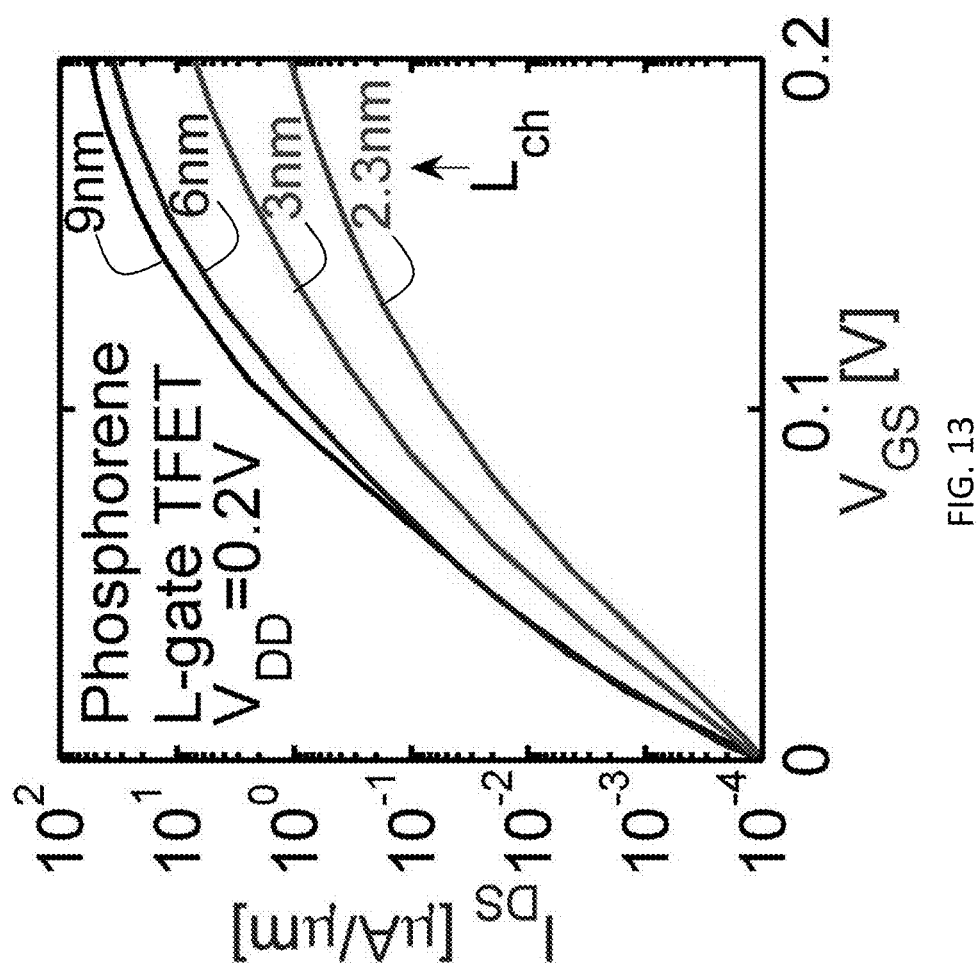
FIG. 13 is a graph of $I_{DS}$ measured in µA/µm vs. $V_{GS}$ measured in volts.

Referring to FIG. 13, a graph of $I_{ON}$ measured in µA/µm vs. $V_{GS}$ measured in volts is provided for different channel lengths, showing examples of ultra-scaled L-gate TFETs with channel lengths from 9 nm down to 2.3 nm with a $V_{DD}$ of 0.2V. In ultra-scaled TFETs, $V_{DD}$ usually does not scale below $V_{DD}$=0.2V since the maximum tunneling energy window is limited by $V_{DD}$. The L-gate TFETs with $L_{ch}$ above 2 nm provide $I_{ON}/I_{OFF} > 10^4$ and satisfy the typical International Technology Roadmap for Semiconductors (ITRS) requirements for the $I_{ON}/I_{OFF}$ ratio.

Figure 14:
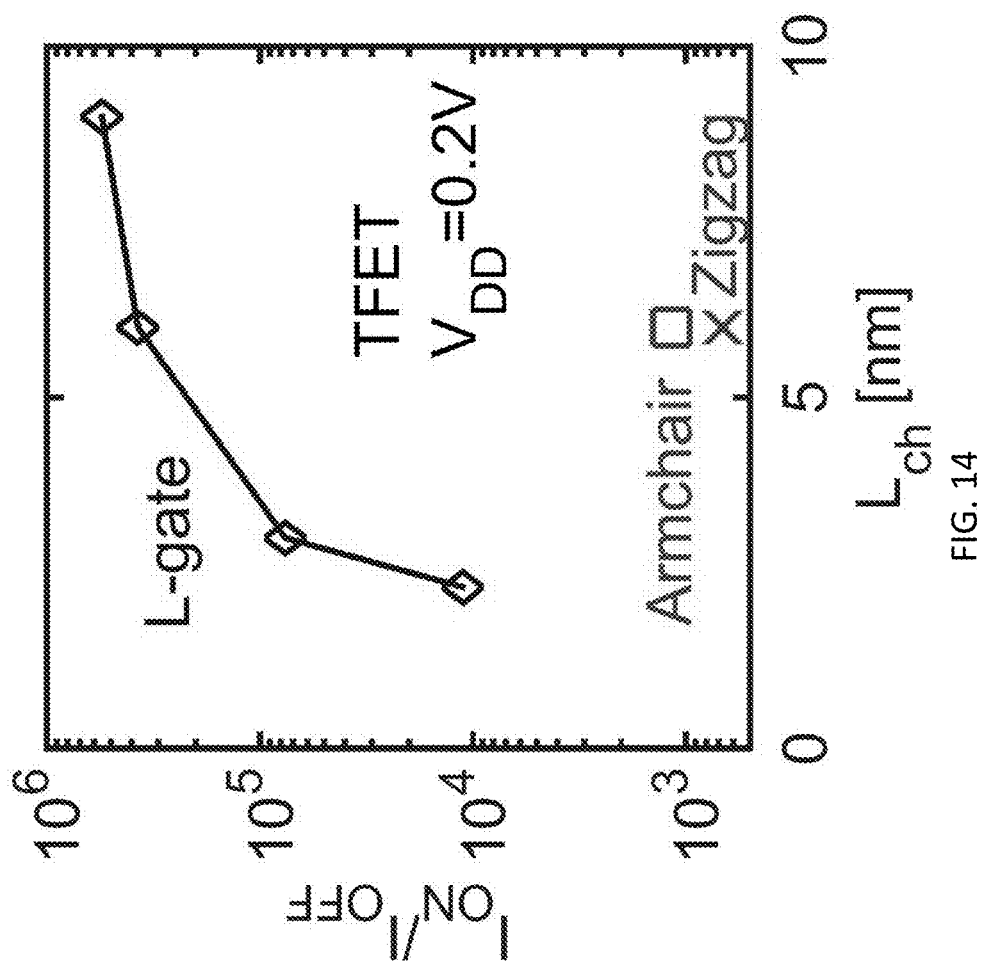
FIG. 14 is a graph of $I_{ON}/I_{OFF}$ ratio vs. a channel length (defined as the average of the first and the second length).

Referring to FIG. 14, a graph of $I_{ON}/I_{OFF}$ ratio vs. channel length is provided showing $I_{ON}/I_{OFF}$ ratios of instant L-gate TFETs as a function of $L_{ch}$. Ultra-scaled channel lengths put a limit on dL. Hence, dL shrinks down from 3.5 nm to 1 nm when the channel length is scaled down from 9 nm to 2.3 nm. Therefore, reduction of $L_{ch}$, results in reduction of dL based on a $L_{ch}$/dL of about 3. L-gate TFETs with channel lengths down to 2 nm provide an $I_{ON}/I_{OFF}$ ratio larger than $10^4$ (required by the International Technology Roadmap for Semiconductors (ITRS) as a minimum amount of $I_{ON}/I_{OFF}$ ratio). Thus, the presently disclosed L-gate TFETs with a channel material with anisotropic m* enable successful scaling of TFETs down to channel lengths of only a few atoms. The square symbol and the "X" symbol represent the device described above in reference to FIG. 11 (i.e., the regular shaped non-L-shaped channel with $L_{ch}$ of 6 nm). As discussed above, these devices produced inferior $I_{ON}/I_{OFF}$ ratios of about $10^3$. In FIG. 14, the $I_{OFF}$ was maintained at $10^{-4}$ µA/µm.

The process by which the TFET devices of the present disclosure are made are based on typical MOSFET fabrication processes, known to a person having ordinary skill in the art. When the channel material is a 2-D type material, an exemplary transfer process for these 2D material is found in U.S. Pat. App. Pub. No. 20120061728 for Javey, incorporated by reference in its entirety into the present disclosure. Where the channel material is a 3-D type material, typical growth or deposition processes (e.g., chemical vapor deposition, epitaxial growth, plasma enhanced chemical vapor deposition, etc.) known to a person having ordinary skill in the art can be employed.

The invention is inclusive of combinations of the aspects described herein. References to "a particular aspect" and the like refer to features that are present in at least one aspect of the invention. Separate references to "an aspect" (or "embodiment") or "particular aspects" or the like do not necessarily refer to the same aspect or aspects; however, such aspects are not mutually exclusive, unless so indicated or as are readily apparent to one of skill in the art. The use of singular or plural in referring to "method" or "methods" and the like is not limiting. The word "or" is used in this disclosure in a non-exclusive sense, unless otherwise explicitly noted.

The invention has been described in detail with particular reference to certain preferred aspects thereof, but it will be understood that variations, combinations, and modifications can be effected by a person of ordinary skill in the art within the spirit and scope of the invention.

The invention claimed is:

1. A tunnel field effect transistor (TFET) device, comprising:
   a substrate;
   heavily doped source and drain regions disposed at opposite ends of the substrate separated by a channel region, where the channel region is intrinsic or lightly doped with doping of less than $10^{18}$/cm$^3$ and the source and drain regions doped with doping of between about $10^{18}$/cm$^3$ to about $10^{21}$/cm$^3$, collectively forming a structure wherein the structure is PiN or NiP;
   a gate terminal separated from the channel region by a dielectric layer;
   a source and drain terminal coupled to the source and drain regions, respectively,
   the channel region comprising a channel material having a first effective mass along a longitudinal axis extending from the source region to the drain region and a second effective mass along a lateral axis perpendicular to the longitudinal axis, wherein a ratio of the first effective mass to the second effective mass is between 1 and 50, the channel region comprising a first substantially parallelogram portion having a first length defined along a longitudinal axis extending from the source region to the drain region and a second substantially parallelogram portion connected to the first substantially parallelogram portion having a second length defined along the longitudinal axis and larger than the first length, the TFET device having an effective channel length defined along the longitudinal axis that is an average of the first and second lengths.

2. The TFET device of claim 1, the channel region comprising one or more layers selected from the group consisting of i) 2-dimensional inherently anisotropic effective mass material made from phosphorene, titanium trisulfide, or any combination thereof; ii) 2-dimensional inherently isotropic effective mass material made from transition metal dichalcogenide including molybdenum disulfide, tungsten disulfide, molybdenum diselenide, tungsten diselenide, molybdenum ditelluride, or any combination thereof; and iii) 3-dimensional bulk material made from Si, germanium, gallium arsenide (GaAs), an alloy of silicon and germanium, indium phosphide, or any combination thereof, wherein, if formed, the 2-dimensional inherently isotropic effective mass material and the 3-dimensional bulk material are formed to induce the first effective mass and the second effective mass.

3. The TFET device of claim 1, the dielectric layer made from $HfO_2$, $SiO_2$, $Al_2O_3$, or any combination thereof.

4. The TFET device of claim 1, the gate, source, and drain terminals made from Al, Cu, Ni, a heavily-doped silicon, tungsten, and metal silicides from the group consisting essentially of $TiSi_2$, $MoSi_2$, and $WSi_2$, or any combination thereof.

5. The TFET device of claim 1, wherein the channel region is L-shaped.

6. The TFET device of claim 1, wherein the channel region is V-shaped.

7. The TFET device of claim 1, the effective channel length having a value of about 2 nm to about 20 nm.

8. The TFET device of claim 1, the difference between the second length and the first length (dL) having a value of about 1 nm to about 10 nm.

9. The TFET device of claim 8, the TFET having a ratio of drain to source current ($I_{DS}$) in an on state to $I_{DS}$ in an off state of between about $10^4$ to about $10^7$.

10. The TFET device of claim 9, the TFET $I_{DS}$ current in the on state for a supply voltage applied to the drain region of about 0.2 V, and $I_{DS}$ in the off state of about $10^{-4}$ µA/µm, a dL of about 3 nm is between about 1 µA/µm to about 50 µA/µm.

* * * * *